United States Patent
Kim et al.

(10) Patent No.: US 7,818,159 B2
(45) Date of Patent: Oct. 19, 2010

(54) INTELLIGENT SYSTEM AND METHOD FOR MONITORING GENERATOR REACTIVE POWER LIMIT USING MACHINE MODEL PARAMETERS

(75) Inventors: Dong Joon Kim, Changwon (KR); Young Hwan Moon, Gyeonggi-do (KR); Jae Young Yoon, Changwon (KR)

(73) Assignee: Korea Electrotechnology Research Institute (KR)

( * ) Notice: Subject to any disclaimer, the term of this patent is extended or adjusted under 35 U.S.C. 154(b) by 516 days.

(21) Appl. No.: 11/842,197

(22) Filed: Aug. 21, 2007

(65) Prior Publication Data
US 2008/0052059 A1   Feb. 28, 2008

(30) Foreign Application Priority Data
Aug. 22, 2006   (KR)   ........................ 10-2006-0079108

(51) Int. Cl.
G06F 17/50   (2006.01)
(52) U.S. Cl. ............................................. 703/18; 703/2
(58) Field of Classification Search ............... 703/2, 703/13, 18
See application file for complete search history.

(56) References Cited

U.S. PATENT DOCUMENTS 3,857,027 A * 12/1974 Carlson et al. ................ 703/18
7,096,175 B2 * 8/2006 Rehtanz et al. ............... 703/18
7,277,779 B2 * 10/2007 Zima et al. ................... 700/292

OTHER PUBLICATIONS

Brand et al., K.P. Three-Phase Measurement Evaluation Using a High-Speed Processor with Snapshot Facility, IEEE Transactions on Power Delivery, vol. 3, Iss. 3, Jul. 1988, pp. 867-873.*
Bolsens et al., B. Three-Phase Observer-based Low Distortion Grid Current Controller Using an LCL Output Filter, IEEE, Power Electronics Specialists Conference, 2005, pp. 1705-1711.*

* cited by examiner

Primary Examiner—Russell Frejd
(74) Attorney, Agent, or Firm—Thomas, Kayden, Horstemeyer & Risley, LLP (57) ABSTRACT

Disclosed herein are an intelligent system and method for monitoring a generator reactive power limit using machine model parameters. The intelligent system and method for monitoring a generator reactive power limit using machine model parameters can calculate a maximum reactive power limit corresponding to over-excitation and a generator terminal voltage corresponding to under-excitation, estimate a correct field current even when system variable are changed, and monitor the generator reactive power limit by using machine model parameters and a one-machine infinite bus, to thereby supply a maximum or minimum reactive power to a power system within an allowable generator reactive power limit and prevent a generator trip caused by the reactive power limit and a power failure over a wide area.

16 Claims, 7 Drawing Sheets

INTELLIGENT SYSTEM AND METHOD FOR MONITORING GENERATOR REACTIVE POWER LIMIT USING MACHINE MODEL PARAMETERS

BACKGROUND OF THE INVENTION

1. Field of the Invention

The present invention relates to an intelligent system and method for monitoring a generator reactive power limit using machine model parameters, and more particularly, to an intelligent system and method for monitoring a generator reactive power limit using machine model parameters, which can calculate a maximum reactive power limit corresponding to over-excitation and a generator terminal voltage corresponding to under-excitation, estimate a correct field current even when system variable are changed, and monitor the generator reactive power limit by using machine model parameters and a one-machine infinite bus, to thereby supply a maximum or minimum reactive power to a power system within allowable generator reactive power limit and prevent a generator trip caused by the reactive power limit and a power failure over a wide area.

2. Background of the Related Art

References for the present invention are as follows:

[1] CWG & MVWG, "Test Guidelines for Synchronous unit Dynamic Testing and Model Validation", February, 1997, WSCC. www.wecc.biz;
[2] P. Kundur, Power System Stability and Control, PP. 101-102, 1994, McGraw-Hill;
[3] F. P. de Mello, L. N. Hannett, "Representation of Saturation in Synchronous Machines", IEEE Transactions on Power Systems, Vol. PWRS-1, No. 4, November 1988, pp. 8-18;
[4] F. P. de Mello, J. R. Ribeiro, "Derivation of Synchronous Machine Parameters from Tests,", IEEE PWR Apparatus and Systems, Vol. PAS-96, No. 4, July/August 1977;
[5] EPRI Report EL-1424, "Determination of Synchronous Machine Stability Constants," Vol. 2, prepared by Ontario Hydro, December 1980;
[6] EPRI Report EL-1424, "Determination of Synchronous Machine Stability Constants," Vol. 3, prepared by PTI, December 1980;
[7] Bharat Bhargava, "Synchronized Phasor Measurement System Project at Southern California Edison Co.", IEEE PES SM 1999, pp. 18-22, 1999;
[8] Magnus Akke, "Phasor Measurement Applications in Scandinavia," IEEE PES T&D Conference and Exhibition 2002: Asia Pacific, pp. 480-484, 2002;
[9] Report, "Aug. 14, 2003 Outage Sequence of Events", U.S./Canada Power Outage Task Force, Sep. 12, 2003;
[10] G. W. Stagg and A. H. Abiad, Computer Method in Power System Analysis McGraw-Hill, 1968;
[11] C. Lemaitre, J. P. Paul, J. M. Tesseron, Y. Harmand, and Y. S. Zhao, "An indicator of the Risk of voltage Profile Instability for Real-Time Control Applications," IEEE Summer Meeting 1989, Paper 89Sm713-9 PWRS;
[12] V. Ajjarapu and C. Christy, "The Continuation Power Flow: A Tool for Steady State Voltage Stability Analysis," IEEE PICA Conference Prodeedings, pp. 304-311, May 1991;
[13] N. Flatabo, R. Ognedal, and T. Carlsen, "Voltage Stability Condition in a Power Transmission System Calculated by Sensitivity Methods," IEEE Trans.;
[14] C. Lemaitre, J. P. Paul, J. M. Tesseron, Y. Harmand, and Y. S. Zhao, "An indicator of the Risk of voltage Profile Instability for Real-Time Control Applications," IEEE Summer Meeting 1989, Paper 89Sm713-9 PWRS; and
[15] TEST GUIDELINES FOR SYNCHRONOUS UNIT DYNAMIC TESTING AND MODEL VALIDATION, 1997, WSCC.

A generator reactive power limit is related to voltage stability of a power system. The voltage stability is detected using a method of monitoring a bus voltage of the power system (refer to references [11], [12], [13] and [14]). A large-scale power failure due to an over-excitation trip of a power plant has recently occurred (refer to reference [15]), and there is every possibility that a power failure occurs because of a trip caused by over-excitation or under-excitation of a power plant. Accordingly, a method of effectively monitoring the generator reactive power limit is required. However, conventional techniques cannot meet this requirement.

A conventional method of monitoring a generator reactive power limit analyzes and judges the current generator operating state by a field generator operator using a capability curve, an under-excitation limiter (UEL) limit, and an over-excitation limiter (OEL) limit provided by a generator manufacturer. This method is an approximate technique depending on the capability of the generator operator, and thus it is difficult to estimate a correct generator reactive power operation when power system variables are changed. That is, the conventional generator reactive power limit monitoring method has the following problems.

Figure 1:
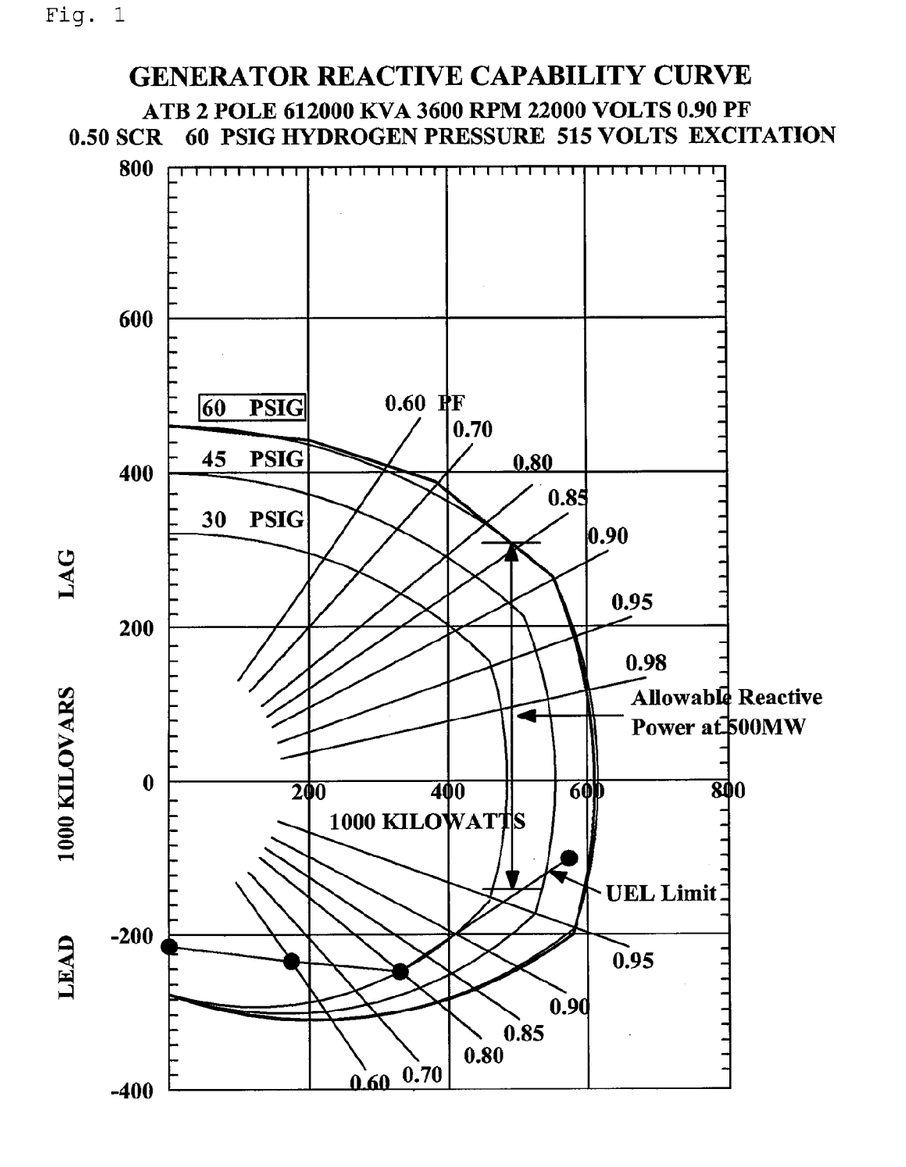
FIG. 1 illustrates a generator reactive capability curve according to a prior art.

Firstly, it is impossible to calculate a reactive power limit with respect to an OEL generator field current limit and indicate the calculated result on a generator reactive power capability curve. In general, a method of monitoring the reactive power limit of a generator while the generator is operating uses a generator reactive capability curve illustrated in FIG. 1. The generator reactive capability curve illustrated in FIG. 1 indicates an allowable reactive power at 500 MW generator power under 60 PSIG hydrogen pressure. A minimum reactive power limit according to under-excitation can be monitored by indicating an UEL limit on the generator reactive capability curve as illustrated in FIG. 1. In terms of monitoring of a maximum reactive power limit according to over-excitation, however, an OEL limit is set to a generator field current $i_{fd}$, and thus it is difficult to calculate and indicate a reactive power limit with respect to the OEL generator field current limit. This is because the maximum reactive power limit is varied according to a generator output condition, a terminal voltage and a system voltage. Accordingly, a method of indicating the reactive power limit with respect to the OEL generator field current limit on the capability curve is required.

Secondly, it is impossible to calculate or estimate a terminal voltage corresponding to a reactive power limit with respect to an UEL and indicate the terminal voltage on the capability curve. An UEL limit corresponds to a ratio of a reactive power Qe to an active power Pe, and thus the UEL limit can be indicated on the capability curve as illustrated in FIG. 1. However, the terminal voltage of a generator is important in the actual operation of the generator. The conventional technique has difficulties in calculating or estimating the terminal voltage corresponding to the reactive power limit with respect to the UEL and indicating the terminal voltage on the capability curve.

Thirdly, it is impossible to estimate a variation in power system variables and indicate a maximum generator reactive power limit on the capability curve. A generator is not operated at a single operating point for ceaselessly generating large and small power system disturbances. For example, a generator terminal voltage, a generator active power, a generator reactive power and a network voltage change momentarily. If a generator operator can estimate these power system variables and prepare for a variation in the power system variables, power system reliability is improved. However, there is a limit in this manual method, and thus a method of estimating a variation in the power system variables according to a variation in generator power and automatically indicating the maximum generator reactive power limit on the capability curve is required.

Fourthly, a reactive power limit with respect to a generator over-voltage limit and a generator under-voltage limit cannot be calculated. The generator reactive power limit is affected by the generator over-voltage limit and the under-voltage limit as well as the OEL limit and the UEL limit. Generally, a generator over-voltage and a generator under-voltage are respectively 105% and 95% of a rated voltage. Accordingly, a method of calculating the reactive power limit with respect to the set generator over-voltage limit and the generator under-voltage limit is needed.

SUMMARY OF THE INVENTION

Accordingly, the present invention has been made in view of the above-mentioned problems occurring in the prior art, and it is a primary object of the present invention to provide an intelligent system and method for estimating and monitoring a correct generator reactive power limit using machine model parameters even when system variables such as a voltage and an active power are changed in a power plant.

Another object of the present invention is to provide an intelligent system and method for monitoring a generator reactive power limit using machine model parameters, which can estimate and monitor the generator reactive power limit to supply a maximum reactive power or a minimum reactive power to a power system within an allowable generator reactive power limit.

Yet another object of the present invention is to provide an intelligent system and method for monitoring a generator reactive power limit using machine model parameters to prevent a generator trip due to over-excitation and under-excitation and a large-scale power failure and supply a maximum reactive power to a power system.

To accomplish the above objects, according to one aspect of the present invention, there is provided an intelligent system for monitoring a generator reactive power limit using machine model parameter, which comprises: a real-time phasor measurement system for converting data measured from a three-phase power line connected to a generator through a current transformer and a potential transformer into phasors to calculate a terminal voltage, a terminal current, a reactive power and an active power in terms of root mean square (RMS) value; and a host computer for calculating the generator reactive power limit using the RMS data from the real-time phasor measurement system, a one-machine infinite bus, and the machine model parameters.

According to another aspect of the present invention, there is also provided an intelligent method for monitoring a generator reactive power limit using machine model parameters, which comprises: a first step of constructing machine model parameters and system data; a second step of reading measured data from a real-time phasor measurement system and storing the read data; a third step of executing a reactive power limit calculating method according to a system condition; and a fourth step of visualizing the calculated reactive power limit.

According to another aspect of the present invention, there is also provided a method for calculating a reactive power limit according to a system condition, which comprises: a first step of inputting an initial condition ($P_o$, $Q_o$, $V_{to}$) and a system equivalent impedance ($X_s$); a second step of carrying out at least one of calculation of a generator internal field current $i_{fdo}$ and a load angle $\delta_o$ using machine model parameters, calculation of an infinite bus voltage $V_{inf}$, calculation of a terminal voltage $V_{to\_OEL}$ with respect to an OEL field current limit $i_{fdo\_OEL}$, calculation of reactive power limits with respect to a maximum operation terminal voltage $V_{to\_max}$ and a minimum operation terminal voltage $V_{to\_min}$, calculation of a maximum limit reactive power value $Q_{i\_max}$ corresponding to an output power $P_i$ (i=1, 2, ...), calculation of a terminal voltage $V_{t\_UEL}$ with respect to an UEL limit minimum reactive power $Q_{UEL\_lim}$, and calculation of a reactive power limit according to a variation in the infinite bus voltage $V_{inf}$; and a third step of checking whether the current operating point is included in a reactive power limit danger area, to perform warning of reactive power limit danger when the current operating point is included in the danger area, or finish the routine when the current operating point is not included in the danger area.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

The present invention will now be described more fully with reference to the accompanying drawings, in which exemplary embodiments of the invention are shown. The invention may, however, be embodied in many different forms and should not be construed as being limited to the embodiments set forth herein, rather, these embodiments are provided so that this disclosure will be thorough and complete, and will fully convey the concept of the invention to those skilled in the art.

Figure 2:
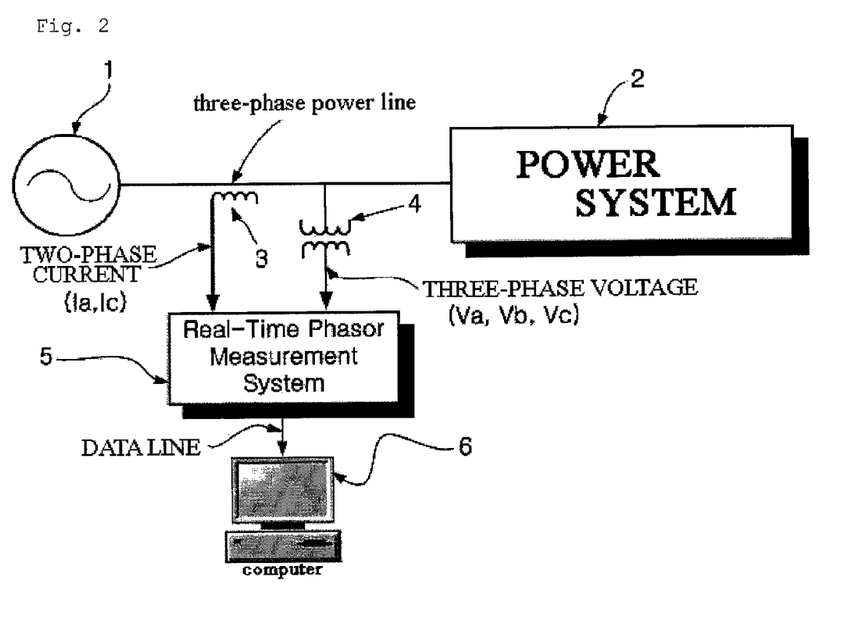
FIG. 2 illustrates an intelligent system for monitoring a generator reactive power limit according to an embodiment of the present invention.

FIG. 2 illustrates an intelligent system for monitoring a generator reactive power limit according to an embodiment of the present invention. Referring to FIG. 2, electric power generated by a generator 1 is transmitted to a power system 2 through a three-phase power line, and a real-time phasor measurement system 5 corresponding to a target system measures a generator terminal current and a generator terminal voltage from the three-phase power line connected to the generator 1 through a current transformer 3 and a potential transformer 4. The measured data is converted into phasors, and an RMS terminal voltage, an RMS terminal current, a reactive power and an active power are calculated and transmitted to a host computer 6 at a predetermined time interval. The host computer 6 estimates and calculates the generator reactive power limit using root mean square (RMS) data received from the real-time phasor measurement system 5, a one-machine infinite bus and machine model parameters. According to circumstances, the host computer 6 visualizes and outputs a warning message.

The real-time phasor measurement system 5 converts measured waveform data into RMS values and calculates a frequency, an RMS active power and an RMS reactive power using the current and the voltage respectively measured by the current transformer 3 and the potential transformer 4. The function of the real-time phasor measurement system 5 can be known from references [7] and [8].

A one-machine infinite bus model used in the host computer 6 is a load flow calculation model and is used to initialize state variables of a generator. Numerical analysis of power system normal state is performed through a load flow calculating method. The load flow calculating method changes actual power variables to per unit values and calculates power flow in consideration of only positive sequence. The load flow calculating method can be known from reference [10]. Furthermore, the machine model parameters used in the host computer 6 are obtained using a model parameter inducing method through generator testing. The model parameter inducing method can be known from references [1] through [6].

The one-machine infinite bus model calculates an infinite bus voltage $V_{inf}$ using the measured data, that is, $V_t$, P and Q. The infinite bus voltage $V_{inf}$ is hardly changed in case of a large power system. An equivalent impedance used to calculate the infinite bus voltage $V_{inf}$ corresponds to the sum of a generator step-up transformer impedance and a power transmission line impedance.

The machine model parameters are used to calculate an internal load angle and a field current of the generator using a measured initial condition $P_o$, $Q_o$ and $V_t$. Verified machine model parameters include $X_d$ (Vertical axis synchronous reactance), $X_q$ (Horizontal axis synchronous reactance), $X_d'$ (Vertical axis transient reactance), $X_q'$ (Horizontal axis transient reactance), X" (Initial transient reactance), $X_l$ (Leakage reactance), S(1.0) (Saturation coefficient), and S(1.2) (Saturation coefficient).

Figure 3:
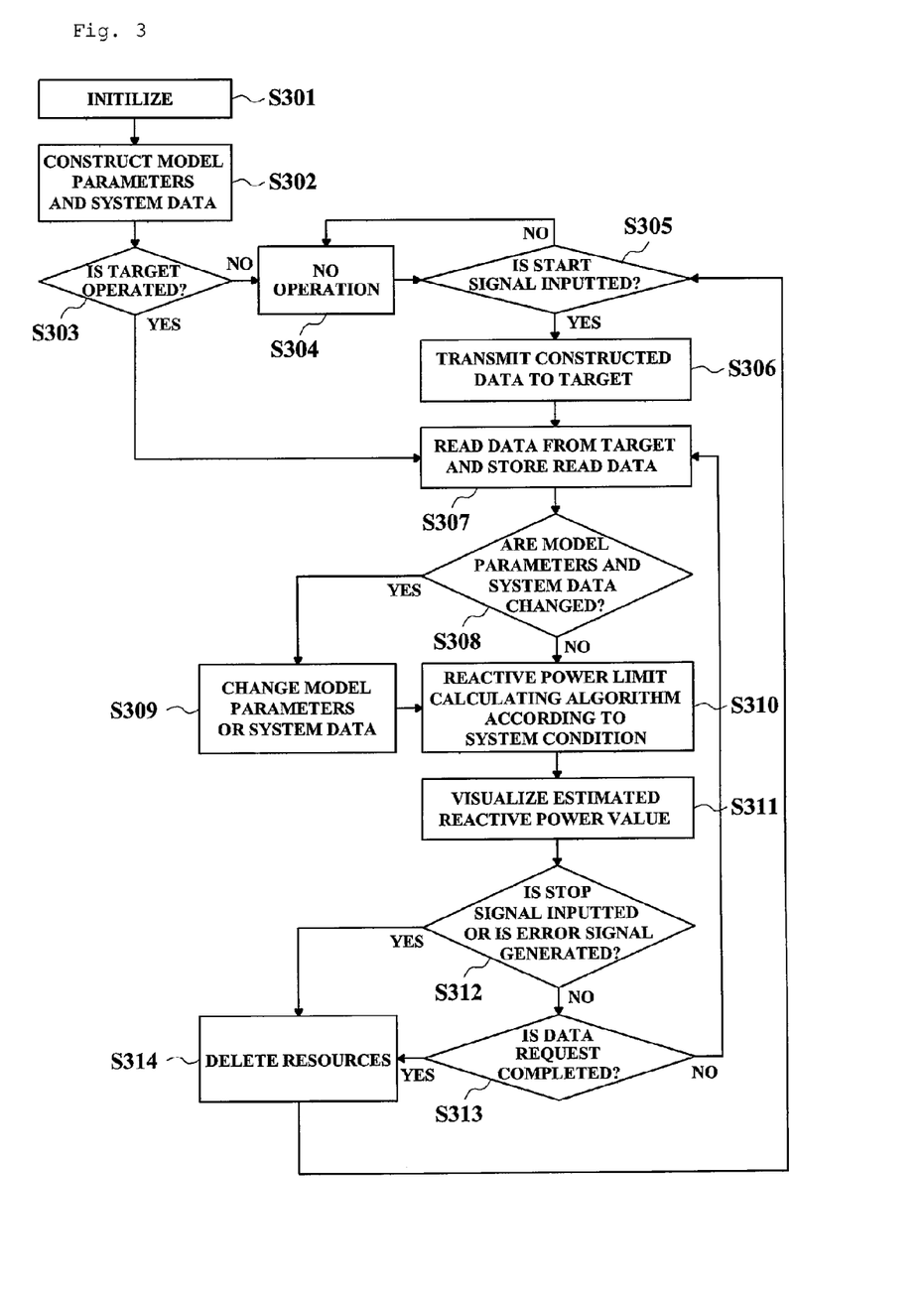
FIG. 3 is a flow chart of an intelligent method for monitoring a generator reactive power limit according to an embodiment of the present invention.

FIG. 3 is a flow chart of an intelligent method for monitoring a generator reactive power limit according to an embodiment of the present invention. FIG. 3 illustrates an intelligent generator reactive power limit calculating method carried in the host computer 6 of the intelligent generator reactive power limit calculating system illustrated in FIG. 2.

First of all, the host computer 6 is initialized in step S301, and then machine model parameters and system data are constructed in step S302. Subsequently, it is checked whether the real-time phasor measurement system 5 is operated in step S303. When the real-time phasor measurement system 5 is not operated in step S304, it is checked whether a start signal of the real-time phasor measurement system 5 is inputted in step S305. When the start signal is not inputted, steps S304 and S305 are repeated. When the start signal is inputted in step S305, the constructed data is transmitted to the real-time phasor measurement system 5 in step S306, and measured data is read from the real-time phasor measurement system 5 and stored in step S307. When the real-time phasor measurement system 5 is operated, the measured data is read from the real-time phasor measurement system 5 and stored in step S307.

Subsequently, it is checked whether the machine model parameters and the system data need to be changed in step S308. When it is required to change the machine model parameters and the system data, the machine model parameters and the system data are changed in step S309, and a reactive power limit calculating algorithm according to a system condition is performed in step S310. When there is no need to change the machine model parameters and the system data, the reactive power limit calculating algorithm according to the system condition is directly carried out in step S310. Then, a reactive power estimation value is visualized in step S311, and it is checked whether a stop signal is inputted or whether an error signal is generated in step S312. When the stop signal is not inputted or the error signal is not generated, it is checked whether data request is finished in step S313. When data request is not finished yet, step S307 is performed. When data request is completed, resource deletion is carried out in step S314, and then step S305 is performed. When the stop signal is inputted or the error signal is generated in step S312, the resource deletion is carried out in step S314, and then step S305 is performed.

Figure 4:
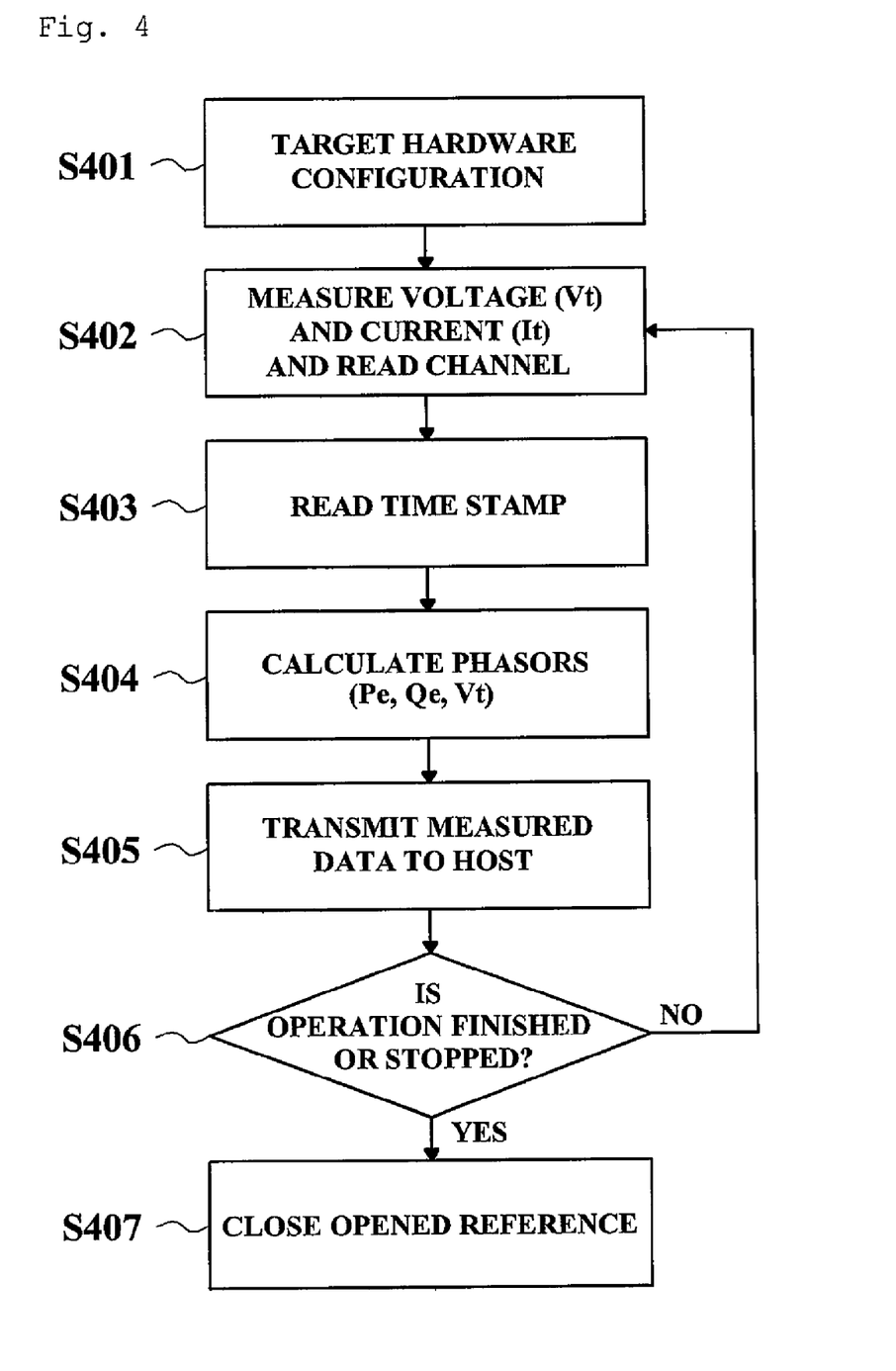
FIG. 4 is a flow chart of a phasor calculating method of a real-time phasor measurement system according to an embodiment of the present invention.

FIG. 4 is a flow chart of a phasor calculating method of the real-time phasor measurement system 5 according to an embodiment of the present invention. Hardware configuration of the real-time phasor measurement system 5 is carried out in step S401. Then, a voltage Vt and a current It are measured and a channel is read in step S402. Subsequently, a time stamp is read in step S403, phasors Pe, Qe and Vt are calculated in step S404, and measured data is transmitted to the host computer 6 in step S405. Then, it is checked whether the operation is finished or a stop signal is inputted in step S406, and an opened reference is closed in step S407 when the stop signal is inputted. When the stop signal is not inputted, step S402 is executed.

Figure 5:
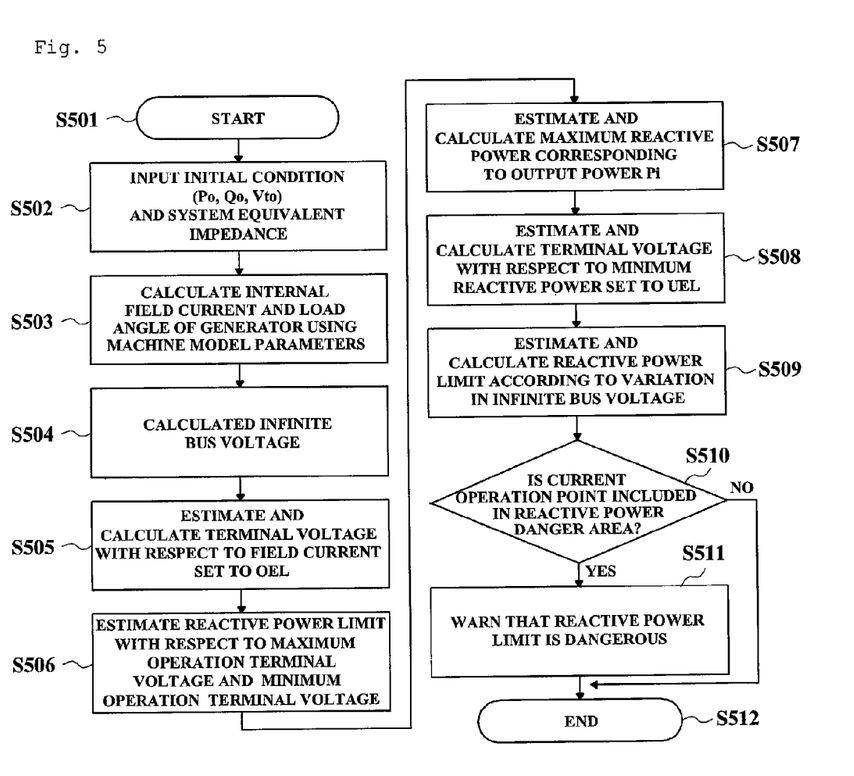
FIG. 5 is a flow chart of a reactive power limit calculating method according to an embodiment of the present invention.

FIG. 5 is a flow chart of a reactive power limit calculating method according to an embodiment of the present invention. FIG. 5 illustrates the step S310 of FIG. 3.

Referring to FIG. 5, when a reactive power limit calculating process according to a system condition is started in step S501, an initial condition $P_o$, $Q_o$ and $V_{to}$ and a system equivalent impedance $X_s$ are inputted in step S502. Then, a generator internal field current $i_{fdo}$ and a load angle $\delta_o$ are calculated using machine model parameters in step S503, and an infinite bus voltage $V_{inf}$ is calculated in step S504. Subsequently, a terminal voltage $V_{to\_OEL}$ with respect to an OEL field current limit $i_{fdo\_OEL}$ is calculated in step S505, and reactive power limits with respect to a maximum operation terminal voltage $V_{to\_max}$ and a minimum operation terminal voltage $V_{to\_min}$ are calculated in step S506. Furthermore, a maximum limit reactive power value $Q_{i\_max}$ corresponding to an output power $P_i$ (i=1, 2, . . . ) is calculated in step S507, a terminal voltage $V_{t\_UEL}$ with respect to an UEL limit minimum reactive power $Q_{UEL\_lim}$ is calculated in step S508, and a reactive power limit according to a variation in the infinite bus voltage $V_{inf}$ is calculated in step S509. Then, it is checked whether the current operating point is included in a reactive power limit danger area in step S510, and warning of reactive power limit danger is performed in step S511 when the current operating point is included in the danger area. When the current operating point is not included in the danger area, the process is ended in step S512. According to the reactive power limit calculating method illustrated in FIG. 5, the problems of the conventional generator reactive power limit monitoring method can be solved.

Specifically, the first problem of the conventional generator reactive power limit monitoring method is solved as follows.

The terminal voltage $V_{to\_OEL}$ with respect to the OEL field current limit $i_{fdo\_OEL}$ is estimated and calculated (S505), and thus the reactive power limit $Q_{o\_OEL}$ with respect to the OEL generator field current limit can be indicated on the generator reactive power capability curve. The terminal voltage $V_{to\_OEL}$ with respect to the OEL field current limit $i_{fdo\_OEL}$ is estimated and calculated as follows.

When generator variables which are measured while the generator is operating include following variables, an infinite bus voltage $V_{inf\_o}$ (unknown value) is calculated using the following generator variables and Equation 1. This can be easily calculated because there are only a single equation and only a single unknown variable (infinite bus voltage).

[Generator Variables]

$P_o$ (MW): Current active power $Q_o$ (Mvar): Current reactive power $V_{to}$ (kV): Terminal voltage of the currently operating generator $X_s$ System equivalent impedance (corresponding to the sum of a transformer impedance and a power transmission line impedance)

$$P_o + jQ_o = V_{to} I_{to}^* = V_{to} \left( \frac{V_{to} - V_{inf\_0}}{jX_s} \right)^* \quad \text{[Equation 1]}$$

The maximum reactive power limit $Q_{o\_OEL}$ with respect to the OEL generator field current limit is obtained by calculating a terminal voltage that allows a calculated generator field current to correspond to a field current set in an OEL using an optimization technique corresponding to the least square method represented by Equation 2. Here, the field current is calculated through a generator modeling formula using machine model parameters.

$$\frac{1}{2} \min_{x=V_t} (i_{if\_OEL} - f(x, V_{inf\_o}, P_o))^2 \quad \text{[Equation 2]}$$

Here, $i_{if\_cal} = f(x)$ denotes the calculated generator field current, and $i_{fd\_OEL}$ represents the OEL generator field current limit.

The second problem of the conventional reactive power limit monitoring method is solved as follows.

The terminal voltage $V_{t\_UEL}$ with respect to the reactive power limit $Q_{UEL\_lim}$ set to the UEL is calculated (S508) using a known infinite bus voltage. That is, the terminal voltage corresponding to UEL reactive power can be calculated using the following variables and Equation 3.

[Variables]

$P_o$ (MW): Current active power $Q_{UEL}$ (Mvar): Current minimum reactive power limit $V_{inf\_o}$ (kV): Infinite bus voltage in the currently operating state $X_s$: System equivalent impedance (corresponding to the sum of a transformer impedance and a power transmission line impedance)

$$P_o + jQ_{UEL} = V_{to} I_{to}^* = V_{t\_UEL} \left( \frac{V_{t\_UEL} - V_{inf\_0}}{jX_s} \right)^* \quad \text{[Equation 3]}$$

The third problem of the conventional reactive power limit monitoring method is solved as follows.

The maximum reactive power limit with respect to the field current at another power operating point (Pi) is calculated (S507) by obtaining a terminal voltage that allows a calculated generator field current to correspond to a field current set to the OEL using an optimization technique corresponding to the least square method represented by Equation 4. Here, the infinite bus voltage is not easily changed. Accordingly, this calculating process is applied well to a large system.

$$\frac{1}{2} \min_{x=V_t} (i_{if\_OEL} - f(x, V_{inf\_o}, P_i))^2 \quad \text{[Equation 4]}$$

Here, $i_{if\_cal} = f(x)$ denotes the calculated generator field current, $P_i$ (i=1, 2, L) represents another generator active power operating point, and $i_{fd\_OEL}$ denotes the OEL generator field current limit.

The fourth problem of the conventional reactive power limit monitoring method is solved as follows.

The step (S506) of calculating a generator reactive power $Q_{max/min}$ with respect to a generator maximum over-voltage limit $V_{max}$ and a generator minimum voltage limit $V_{min}$ at a generator power operating point Po is carried out according to Equation 5. Here, an unknown value to be obtained is $Q_{max/min}$.

$$P_o + jQ_{max/min} = V_{max/min} I_{to}^* = V_{max/min} \left( \frac{V_{max/min} - V_{inf\_0}}{jX_s} \right)^* \quad \text{[Equation 5]}$$

Figure 6:
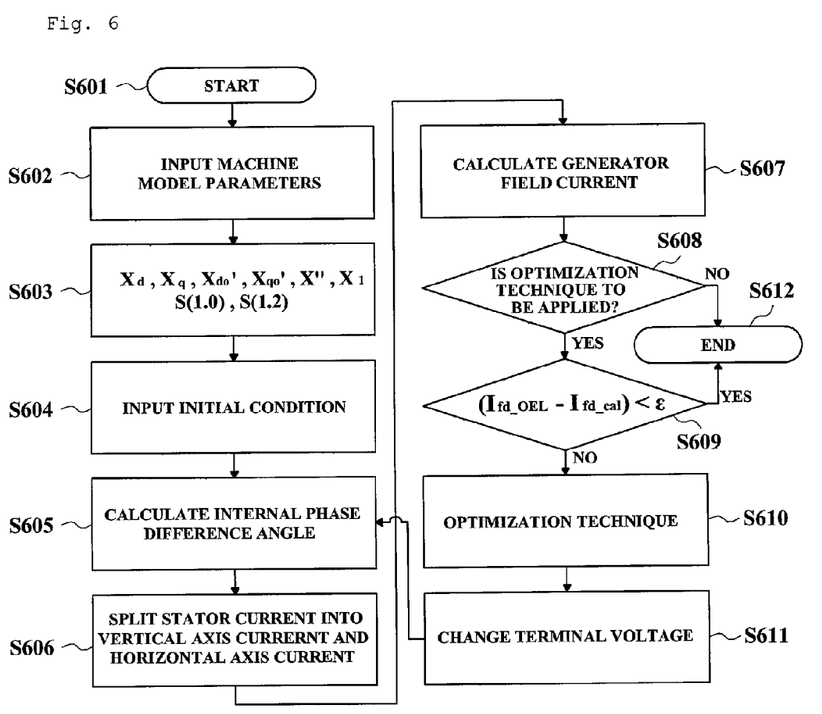
FIG. 6 is a flow chart of a generator field current calculating method according to an embodiment of the present invention.

Here, the generator field current is calculated using a generator field current calculating method illustrated in FIG. 6 when an operating condition is ($P_o$, $Q_{max}$, $V_{max}$) or ($P_o$, $Q_{min}$, $V_{min}$).

FIG. 6 is a flow chart of a generator field current calculating method according to an embodiment of the present invention. FIG. 6 illustrates the step S503 of FIG. 5.

Referring to FIG. 6, when a generator field current calculating process is started in step S601, machine model parameters are inputted in step S602. Specifically, $X_d$, $X_q$, $X_d'$, $X_q'$, X", $X_l$, S(1.0) and S(1.2) are inputted in step S603. Then, an initial condition ($P_o$, $Q_o$, $V_{to}$, $V_{inf\_o}$, $X_s$) is inputted in step S604. Subsequently, an internal phase difference angle δ is calculated in step S605, a stator current is split into a vertical axis current and a horizontal axis current in step S606, and a generator field current $i_{fd\_cal}$ is calculated in step S607. Then, it is determined whether an optimization technique is applied in step S608, and the process is finished in step S612 when the optimization technique is not applied. When the optimization technique is applied, it is determined whether a difference between the OEL generator field current limit $i_{fd\_OEL}$ and the calculated generator field current $i_{fd\_cal}$ is smaller than a generator induced electromotive force ϵ in step S609. The process is finished in step S612 when the difference is smaller than the generator induced electromotive force ϵ. When the difference is greater than the generator induced electromotive force ϵ, the optimization technique is executed in step S610, the terminal voltage $V_t$ is changed in step S611, and the process returns to step S605.

Embodiments

Hereinafter, results obtained by applying the intelligent system and method for monitoring a generator reactive power limit using machine model parameters according to the present invention to 612 MVA large thermal generator (cylindrical) are described. A rated terminal voltage is 22 kV and a base field current is 1175 Amp. Machine model parameters to be used are verified machine model parameters which correspond to the following measured results. PSS/E power system simulation program is used.

—Verified Machine Model Parameters

Table 1 shows a terminal current, an active power, a reactive power, a field current and a load angle which are actually measured. Table 2 shows normal state machine model parameters extracted and verified according to generator testing. Table 3 shows calculation results according to the machine model parameters and measurement results. The field current and the load angle calculated according to the machine model parameters shown in Table 2 nearly correspond to the measured field current and the measured load angle as shown in FIG. 3.

TABLE 2

Verified machine model parameters

| Parameter | Model parameter value | Remark |
|---|---|---|
| Xd | 2.199 | Vertical axis synchronous reactance |
| Xq | 1.587 | Horizontal axis synchronous reactance |
| Xd' | 0.257 | Vertical axis transient reactance |
| Xq' | 0.393 | Horizontal axis transient reactance |
| X" | 0.228 | Initial transient reactance |
| $X_l$ | 0.142 | Leakage reactance |
| S(1.0) | 0.100 | Saturation coefficient |
| S(1.2) | 0.238 | Saturation coefficient |

TABLE 3

Comparison of calculated result according to machine model parameters with measured result

| Measurement No. | Measured $I_{fd\_mea}$(Amp) | Calculated $I_{fd\_cal}$(Amp) | % error | Measured load angle(°) | Calculated load angle(°) | Error (°) |
|---|---|---|---|---|---|---|
| 1 | 2491.382 | 2513.681 | 0.895 | 52.328 | 53.138 | -0.809 |
| 2 | 2616.375 | 2622.347 | 0.228 | 47.954 | 48.406 | -0.452 |
| 3 | 2753.834 | 2759.153 | 0.193 | 44.000 | 44.315 | -0.314 |
| 4 | 2884.731 | 2919.412 | 1.202 | 40.663 | 40.972 | -0.309 |
| 5 | 3057.293 | 3090.257 | 1.078 | 37.714 | 38.156 | -0.442 |
| 6 | 2064.243 | 2036.754 | -1.332 | 44.880 | 44.842 | 0.037 |
| 7 | 2206.295 | 2167.094 | -1.777 | 40.368 | 40.299 | 0.069 |
| 8 | 2339.160 | 2328.513 | -0.455 | 35.886 | 35.958 | -0.072 |
| 9 | 2526.158 | 2534.841 | 0.344 | 32.658 | 32.786 | -0.129 |
| 10 | 1674.504 | 1636.193 | -2.288 | 34.401 | 33.663 | 0.738 |
| 11 | 1859.203 | 1848.778 | -0.561 | 29.426 | 29.134 | 0.292 |
| 12 | 2057.354 | 2057.605 | 0.012 | 25.945 | 25.913 | 0.031 |
| 13 | 2256.161 | 2264.613 | 0.375 | 23.397 | 23.434 | -0.037 |
| 14 | 1327.740 | 1306.323 | -1.613 | 18.178 | 17.081 | 1.097 |
| 15 | 1592.816 | 1578.149 | -0.921 | 14.276 | 13.775 | 0.501 |
| 16 | 1819.835 | 1831.137 | 0.621 | 12.614 | 12.543 | 0.071 |
| 17 | 2012.081 | 2032.884 | 1.034 | 11.759 | 11.792 | -0.033 |

TABLE 1

Measured normal state generator operation data

| Measurement No. | Terminal voltage $V_t$(kV) | Active power P(MW) | Reactive power Q(Mvar) | Field current $I_{fd}$(Amp) | Load angle (Deg) |
|---|---|---|---|---|---|
| 1 | 21.215 | 501.237 | 0.071 | 2491.382 | 52.328 |
| 2 | 21.592 | 500.015 | 50.091 | 2616.375 | 47.954 |
| 3 | 21.994 | 501.509 | 100.064 | 2753.834 | 44.000 |
| 4 | 22.373 | 506.149 | 149.567 | 2884.731 | 40.663 |
| 5 | 22.578 | 508.047 | 200.943 | 3057.293 | 37.714 |
| 6 | 21.319 | 375.248 | -1.591 | 2064.243 | 44.880 |
| 7 | 21.657 | 372.550 | 44.168 | 2206.295 | 40.368 |
| 8 | 22.078 | 369.892 | 94.060 | 2339.160 | 35.886 |
| 9 | 22.445 | 375.047 | 147.029 | 2526.158 | 32.658 |
| 10 | 21.436 | 252.764 | -3.416 | 1674.504 | 34.401 |
| 11 | 21.850 | 252.608 | 50.239 | 1859.203 | 29.426 |
| 12 | 22.220 | 253.414 | 99.836 | 2057.354 | 25.945 |
| 13 | 22.511 | 254.021 | 148.460 | 2256.161 | 23.397 |
| 14 | 21.444 | 115.430 | -6.982 | 1327.740 | 18.178 |
| 15 | 21.852 | 110.961 | 50.067 | 1592.816 | 14.276 |
| 16 | 22.236 | 116.193 | 100.272 | 1819.835 | 12.614 |
| 17 | 22.521 | 120.691 | 140.985 | 2012.081 | 11.759 |

—Equivalent Impedance

A total impedance of a generator step-up transformer and a power transmission line is 0.20 Per unit at 612 MVA.

Figure 8:
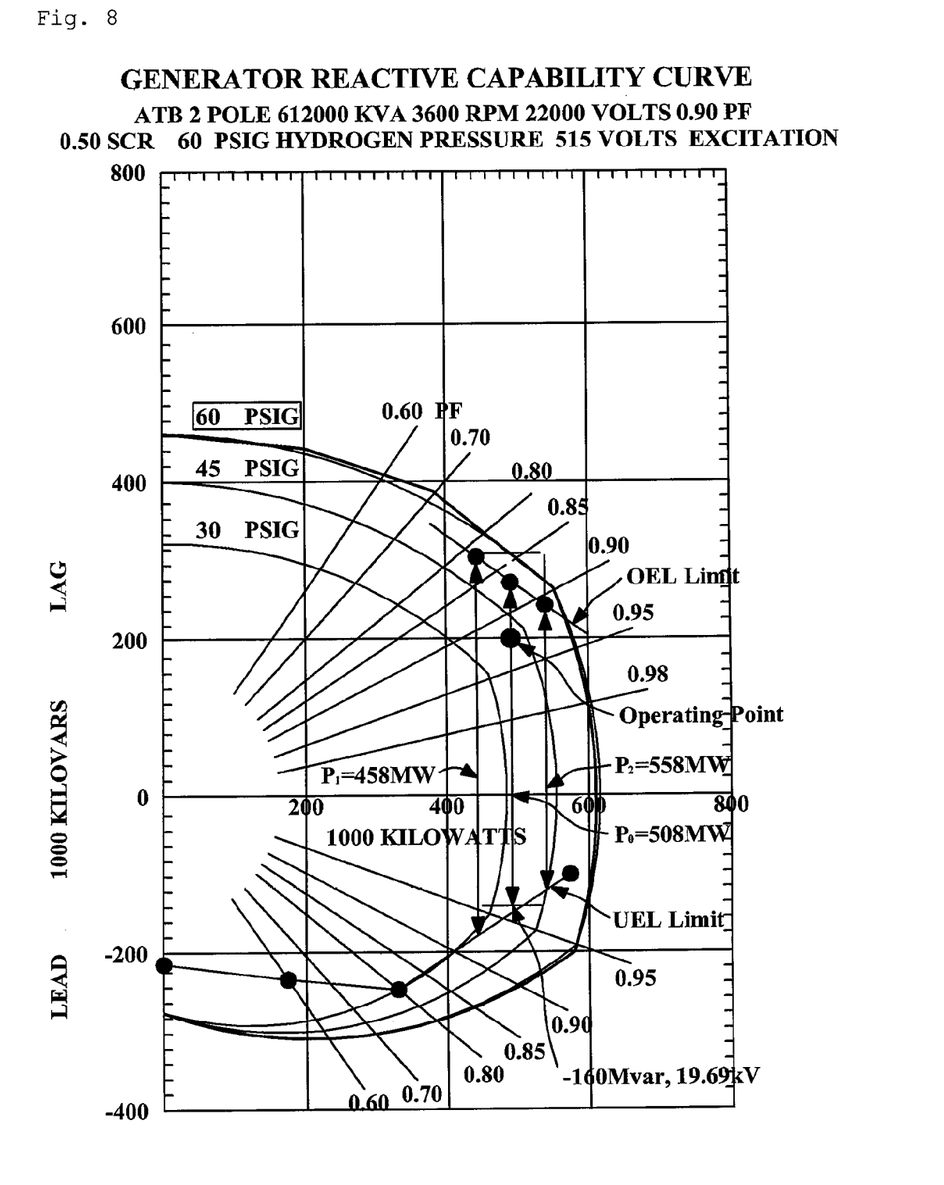
FIG. 8 illustrates a generator reactive capability curve according to an embodiment of the present invention.

—OEL Limit (OEL Limit Illustrated in FIG. 8) and UEL Limit (UEL Limit Illustrated in FIG. 8)

An on-line OEL (AFFL) limit is 3,386 Amp, and an UEL limit is -218.9 Mvar at 0 MW, -233.8 Mvar at 183.6 MW, -253.9 Mvar at 367.2 MW, and -129.9 Mvar at 581.4 MW.

—Infinite Bus Voltage

Figure 7:
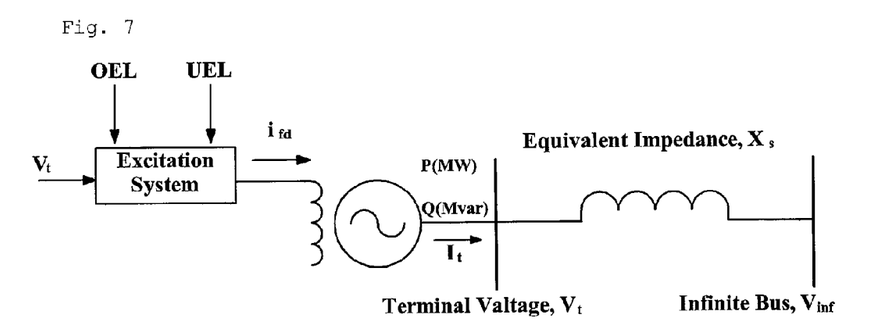
FIG. 7 illustrates a system for calculating an infinite bus voltage according to an embodiment of the present invention.

It assumed that the initial condition of the currently operating generator is as follows. FIG. 7 illustrates a one-machine infinite bus system. An infinite bus voltage satisfying the following initial condition, which is obtained using Equation 1 based on the one-machine infinite bus system illustrated in FIG. 7, is 0.973 Per Unit (rated voltage 22 kV).

[Generator Initial Condition]

Terminal voltage ($V_{to}$): 22.578 kV

Active power ($P_o$): 508.047 MW

Reactive power ($Q_o$) 200.943 Mvar

—Calculation of a Maximum Reactive Power Limit With Respect to the OEL Field Current The OEL field current limit is 3,386 Amp. This value is converted to 2.88 (3386/1175) Per Unit. A terminal voltage or a maximum reactive power limit which allows a generator field current to become 2.88 Per Unit is calculated using an optimization technique. Here, known variables of a power system are as follows.

Infinite bus voltage ($V_{inf}$): 21.406 kV (0.973 Per Unit)
Active power ($P_o$): 508.047 MW
Field current ($I_{fd\_OEL}$): 3,386 Amp (2.88 Per Unit)

An internal field current is calculated using given machine model parameters. A terminal voltage and a maximum reactive power limit which allow the field current to become 2.88 Per Unit are obtained using Equation 2 as follows.

Bus terminal voltage ($V_t$): 23.122 kV (1.051 Per Unit)
Maximum limit reactive power ($Q_{OEL}$): 289.0 Mvar —Calculation of a Terminal Voltage with Respect to an UEL Limit It is assumed that a reactive power limit according to an UEL (UEL Limit of FIG. 8) at 508 MW on the reactive power capability curve illustrated in FIG. 1 is −160 Mvar. A terminal voltage in this case is calculated as follows.

Currently known power variables are as follows.
Infinite bus voltage ($V_{inf}$): 21.406 kV (0.973 Per Unit)
Active power ($P_o$): 508.047 MW
Reactive power ($Q_{UEL}$): −160 Mvar When the terminal voltage ($V_{t\_UEL}$) is estimated using these power variables and Equation 3, 19.6944 kV (0.8952 Per Unit) is obtained. This value is indicated as −160 Mvar, 19.69 kV on the capability curve illustrated in FIG. 8.

—Calculation of a Maximum Reactive Power Limit According to an OEL for Another Generator Active Power First of all, generator active power is increased by 50 MW and the maximum reactive power limit according to the OEL is calculated as follows. Currently known power system variables include an infinite bus voltage ($V_{inf}$) of 21.406 kV (0.973 Per Unit) and an active power ($P_1$) of 558.047 MW. Here, the OEL limit is 3386 Amp (2.88 Per Unit). When the reactive power limit is calculated using Equation 4, a bus terminal voltage ($V_t$) of 22.792 kV (1.036 Per Unit) and a maximum reactive power limit ($Q_{OEL}$) of 248.0 Mvar are obtained.

Then, the generator active power is decreased by 50 MW and the maximum reactive power limit is calculated as follows. Currently known power system variables include an infinite bus voltage ($V_{inf}$) of 21.406 kV (0.973 Per Unit) and an active power ($P_2$) of 458.047 MW. When the reactive power limit is calculated using Equation 4, a bus terminal voltage ($V_t$) of 23.386 kV (1.063 Per Unit) and a maximum reactive power limit ($Q_{OEL}$) of 321.87 Mvar are obtained.

Table 4 shows an OEL reactive power limit with respect to an active power. The OEL reactive power limit with respect to the active power, calculated as above, is indicated on the capability curve of FIG. 8 as $P_1$=458 MW, $P_o$=508 MW, $P_2$=558 MW and Operating Point.

TABLE 4

OEL reactive power limit with respect to an active power

| P (Active power) | $Q_{OEL}$ (Estimated limit reactive power) | Remark |
|---|---|---|
| $P_1$ = 458.047 MW | 321.9 Mvar | |
| $P_o$ = 508.047 MW | 289.0 Mvar | Current operating point, 200.943 Mvar |
| $P_2$ = 558.047 MW | 248.0 Mvar | |

Calculation of a reactive power limit according to a generator over-voltage limit and a generacor under-voltage limit A generator is normally operated 95% to 105% in order to prevent machine insulation of the generator and over-voltage and under-voltage of generator power. Reactive power limits at an over-voltage and an under-voltage of a generator terminal are calculated using Equation 5. Values which can be known from Equation 5 are as follows.

Infinite bus voltage ($V_{inf}$): 21.406 kV (0.973 Per Unit)
Active power ($P_o$): 508.047 MW
Over-voltage and under-voltage limits: $V_{t\_max}$=23.1 kV (1.05 Per Unit), $V_{t\_min}$=20.9 kV (0.95 Per Unit)

Maximum and minimum reactive power limits are calculated through Equation 4 using the aforementioned variables as follows.

Maximum reactive power limit: $Q_{\_max}$=285.63 Mvar
Minimum reactive power limit: $Q_{\_min}$=−19.0 Mvar Accordingly, the intelligent system and method for monitoring a generator reactive power limit using machine model parameters have the following advantages.

First of all, an operator of a generator monitors a maximum reactive power limit according to an OEL, which is estimated at the current operation point, and thus a sudden accident can be prevented and a generator reactive power can be stably provided to a power system.

Secondly, the operator monitors a minimum terminal voltage limit according to an UEL, which is estimated at the current operation point, and thus a sudden accident can be prevented and a generator can absorb a reactive power of a power system.

Thirdly, an OEL reactive power limit according to a variation in a generator active power is estimated and monitored at the current generator active power operating point, and thus stability can be improved and a maximum generator reactive power can be supplied to the power system.

Fourthly, the operator estimates reactive power limits with respect to an OEL and an UEL in advance and operates a generator so that a generator trip caused by over-excitation or under-excitation can be prevented and reliability of supplying power to the power system can be improved.

Fifthly, since a generator trip caused by over-excitation or under-excitation can be prevented, a large-scale power failure due to the generator trip can be prevented.

While the present invention has been described with reference to the particular illustrative embodiments, it is not to be restricted by the embodiments hut only by the appended claims. It is to be appreciated that those skilled in the art can change or modify the embodiments without departing from the scope and spirit of the present invention.

What is claimed is:

1. An intelligent system for monitoring a generator reactive power limit using machine model parameter, the intelligent system comprising:
  a real-time phasor measurement system for converting data measured from a three-phase power line connected to a generator through a current transformer and a potential transformer into phasors to calculate a terminal voltage, a terminal current, a reactive power and an active power in terms of root mean square (RMS) value; and
  a host computer for calculating the generator reactive power limit using the RMS data from the real-time phasor measurement system, a one-machine infinite bus, and the machine model parameters.

2. The intelligent system for monitoring a generator reactive power limit using machine model parameter according to claim 1, wherein the real-time phasor measurement system transmits the RMS data to the host computer at a predetermined time interval.

3. The intelligent system for monitoring a generator reactive power limit using machine model parameter according to claim 2, wherein the host computer calculates an infinite bus voltage using the one-machine infinite bus and the data measured by the real-time phasor measurement system.

4. The intelligent system for monitoring a generator reactive power limit using machine model parameter according to claim 3, wherein the host computer calculates an internal load angle and a field current of the generator using the machine model parameters and the data measured by the real-time phasor measurement system.

5. The intelligent system for monitoring a generator reactive power limit using machine model parameter according to claim 4, wherein the machine model parameters include at least one of a vertical axis synchronous reactance $X_d$, a horizontal axis synchronous reactance $X_q$, a vertical axis transient reactance $X_d'$, a horizontal axis transient reactance $X_q'$, an initial transient reactance $X''$, a leakage reactance $X_l$, saturation coefficients $S(1.0)$ and $S(1.2)$.

6. The intelligent system for monitoring a generator reactive power limit using machine model parameter according to claim 5, wherein the host computer calculates at least one of an infinite bus voltage, a maximum reactive power limit with respect to a field current of a generator over-excitation limiter (OEL), a terminal voltage of a generator under-excitation limiter (UEL), a maximum reactive power limit according to the OEL with respect to another generator active power, and reactive power limits according to generator over-voltage and under-voltage limits and indicates the calculated result on a generator reactive power capability curve.

7. A phasor calculating method of the real-time phasor measurement system of the intelligent system of claim 1, the phasor calculating method comprising the steps of:
    performing hardware configuration of the real-time phasor measurement system;
    measuring a current and a voltage through a current transformer and a potential transformer and reading a channel;
    reading a time stamp;
    calculating a phasor; and
    transmitting the calculated phasor to the host computer of the intelligent system.

8. An intelligent method for monitoring a generator reactive power limit using machine model parameters by means of using the intelligent system for monitoring a generator reactive power limit using machine model parameter comprising a real-time phasor measurement system and a host computer, the method carried out by the host computer comprising:
    a first step of constructing machine model parameters and system data;
    a second step of reading measured data from a real-time phasor measurement system and storing the read data;
    a third step of executing a reactive power limit calculating method according to a system condition; and
    a fourth step of visualizing the calculated reactive power limit,
    wherein, after the first step, it is checked whether the real-time phasor measurement system is operated: when the real-time phasor measurement system is not operated, it is checked whether a start signal is inputted and the constructed data is transmitted to the real-time phasor measurement system to perform the second step when the start signal is inputted, and the second step is carried out when the real-time phasor measurement system is operated.

9. The intelligent method for monitoring a generator reactive power limit using machine model parameters according to claim 8, wherein, after the second step, it is checked whether the machine model parameters and the system data need to be changed: the machine model parameters and the system data are changed and then the third step is executed when it is required to change the machine model parameters and the system data, and the third step is carried out when there is no need to change the machine model parameters and the system data.

10. The intelligent method for monitoring a generator reactive power limit using machine model parameters according to claim 9, wherein, after the fourth step, it is checked whether a stop signal is inputted or whether an error signal is generated: when the stop signal is not inputted and the error signal is not generated it is checked whether data request is finished and then the second step is executed when the data request is not finished, and calculated resources are deleted and then it is checked whether a start signal of the real-time phasor measurement system is inputted when the data request is finished, and when the stop signal is inputted or the error signal is generated the calculated resources are deleted and then it is checked whether the start signal of the real-time phasor measurement system is inputted.

11. The intelligent method for monitoring a generator reactive power limit using machine model parameters according to claim 8, wherein the third step comprises:
    a first step of inputting an initial condition ($P_o$, $Q_o$, $V_{to}$) and a system equivalent impedance;
    a second step of carrying out at least one of calculation of a generator internal field current $i_{fdo}$ and a load angle $\delta_o$ using machine model parameters, calculation of an infinite bus voltage $V_{inf}$ estimation and calculation of a terminal voltage $V_{to\_OEL}$ with respect to an OEL field current limit $i_{fdo\_OEL}$, calculation of reactive power limits with respect to a maximum operation terminal voltage $V_{to\_max}$ and a minimum operation terminal voltage $V_{to\_n}$, calculation of a maximum limit reactive power value $Q_{i\_max}$ corresponding to an output power $P_i$ (i=1, 2, . . . ), calculation of a terminal voltage $V_{t\_UEL}$ with respect to an UEL limit minimum reactive power $Q_{UEL\_lim}$, and calculation of a reactive power limit according to a variation in the infinite bus voltage $V_{inf}$; and
    a third step of checking whether the current operating point is included in a reactive power limit danger area, and performing warning of reactive power limit danger when the current operating point is included in the danger area or finishing the routine when the current operating point is not included in the danger area.

12. The intelligent method for monitoring a generator reactive power limit using machine model parameters according to claim 11, wherein the calculation of the terminal voltage $V_{to\_OEL}$ with respect to the OEL field current limit $i_{fdo\_OEL}$ comprises the steps of:
    calculating an infinite bus voltage using the following Equation 1:

$$P_o + jQ_o = V_{to} I_{to}^* = V_{to}\left(\frac{V_{to} - V_{inf\_0}}{jX_s}\right)^* \qquad \text{[Equation 1]}$$

where $P_o$(MW) denotes the current active power, $Q_o$(Mvar) denotes the current reactive power, $V_{to}$(kV) denotes the terminal voltage of the currently operating generator, and $X_s$ denotes a system equivalent impedance (corresponding to the sum of a transformer impedance and a power transmission line impedance); and
    calculating the terminal voltage which allows a calculated generator field current to correspond to a field current set to an OEL, using an optimization technique corresponding to the least square method of the following Equation 2:

$$\frac{1}{2}\min_{x=V_t}(i_{if\_OEL} - f(x, V_{inf\_o}, P_o))^2 \qquad \text{[Equation 2]}$$

where $i_{if\_cal}$=f(x) denotes the calculated generator field current, and $i_{fd\_OEL}$ represents the OEL generator field current limit.

13. The intelligent method for monitoring a generator reactive power limit using machine model parameters according to claim 11, wherein the calculation of the terminal voltage $V_{t\_UEL}$ with respect to the UEL limit minimum reactive power $Q_{UEL\_lim}$ is carried out using the following Equation 3:

$$P_o + jQ_{UEL} = V_{to}I_{to}^* = V_{t\_UEL}\left(\frac{V_{t\_UEL} - V_{inf\_0}}{jX_s}\right)^* \qquad \text{[Equation 3]}$$

where $P_o$(MW) denotes the current active power, $Q_{UEL}$ (Mvar) denotes the current minimum reactive power limit, $V_{inf\_o}$(kV) denotes an infinite bus voltage in the currently operating state, and $X_s$ denotes a system equivalent impedance (corresponding to the sum of a transformer impedance and a power transmission line impedance).

14. The intelligent method for monitoring a generator reactive power limit using machine model parameters according to claim 11, wherein the calculation of the maximum limit reactive power value $Q_{i\_max}$ corresponding to the output power $P_i$ (i=1, 2, . . . ) is carried out calculating a maximum limit reactive power value at another generator power operating point by obtaining a terminal voltage which allows a calculated field current to correspond to a field current set to an OEL using an optimization technique corresponding to the least square method of the following Equation 4:

$$\frac{1}{2}\min_{x=V_t}(i_{if\_OEL} - f(x, V_{inf\_o}, P_i))^2 \qquad \text{[Equation 4]}$$

where $i_{if\_cal}$=f(x) denotes the calculated generator field current, $P_i$ (i=1, 2, L) represents another generator active power operating point, and $i_{fd\_OEL}$ denotes the OEL generator field current limit.

15. The intelligent method for monitoring a generator reactive power limit using machine model parameters according to claim 11, wherein the calculation of the reactive power limits with respect to the maximum operation terminal voltage $V_{to\_max}$ and the minimum operation terminal voltage $V_{to\_min}$ is carried out using the following Equation 5:

$$P_o + jQ_{max/min} = V_{max/min}I_{to}^* = V_{max/min}\left(\frac{V_{max/min} - V_{inf\_0}}{jX_s}\right)^*. \qquad \text{[Equation 5]}$$

16. The intelligent method for monitoring a generator reactive power limit using machine model parameters according to claim 11, the method comprising:

a first step of inputting machine model parameters and an initial condition ($P_o$, $Q_o$, $V_{to}$, $V_{inf\_o}$, $X_s$);

a second step of calculating an internal phase difference angle δ, splitting a stator current into a vertical axis current and a horizontal axis current, and calculating a generator field current $i_{fd\_cal}$;

a third step of determining whether an optimization technique is to be applied, finishing the routine when the optimization technique is not to be applied, and determining whether a difference between an OEL generator field current limit $i_{fd\_OEL}$ and a calculated generator field current $i_{fd\_cal}$ is smaller than a generator induced electromotive force ϵ when the optimization technique is to be applied; and a fourth step of finishing the routine when the difference is smaller than the generator induced electromotive force ϵ, or performing the optimization technique and changing the terminal voltage $V_t$ and executing the second step when the difference is greater than the generator induced electromotive force ϵ.

\* \* \* \* \*